(12) United States Patent
Deng et al.

(10) Patent No.: US 10,136,569 B2
(45) Date of Patent: Nov. 20, 2018

(54) INSTALLATION FIXTURE FOR INSTALLING SEALING RING

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Ting-Hui Deng, Shenzhen (CN); Long-Fong Chen, New Taipei (TW); Chung-Yuan Chen, New Taipei (TW)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 247 days.

(21) Appl. No.: 15/009,068

(22) Filed: Jan. 28, 2016

(65) Prior Publication Data

US 2017/0191564 A1 Jul. 6, 2017

(30) Foreign Application Priority Data

Dec. 31, 2015 (CN) .......................... 2015 1 1014697

(51) Int. Cl.
| | |
|---|---|
| *H05K 13/04* | (2006.01) |
| *B25B 7/02* | (2006.01) |
| *B25B 7/04* | (2006.01) |
| *B25B 7/00* | (2006.01) |
| *B25B 7/12* | (2006.01) |
| *B25B 27/00* | (2006.01) |

(Continued)

(52) U.S. Cl.
CPC .......... *H05K 13/0404* (2013.01); *B25B 7/00* (2013.01); *B25B 7/02* (2013.01); *B25B 7/04* (2013.01); *B25B 7/12* (2013.01); *B25B 27/0028* (2013.01); *H05K 13/0447* (2013.01); *H05K 13/0486* (2013.01); *H05K 13/0491* (2013.01); *B25B 7/10* (2013.01); *B25B 7/20* (2013.01); *B25B 9/04* (2013.01); *F16J 15/02* (2013.01); *Y10T 29/53174* (2015.01); *Y10T 29/53257* (2015.01)

(58) Field of Classification Search
CPC ........... H05K 13/0404; H05K 13/0447; H05K 13/0486; H05K 13/0491; B25B 7/00; B25B 7/02; B25B 7/04; B25B 7/10; B25B 7/20; B25B 9/04; B25B 7/12; B25B 27/0028; F16J 15/02; Y10T 29/53174; Y10T 29/53257
See application file for complete search history.

(56) References Cited

U.S. PATENT DOCUMENTS

| | | | | |
|---|---|---|---|---|
| 4,179,803 | A * | 12/1979 | Wolkert | ............. H05K 13/0447 29/741 |
| 4,569,550 | A * | 2/1986 | Harigane | ........... H05K 13/0404 29/741 |
| 4,941,700 | A * | 7/1990 | Lin | .................... H05K 13/0491 29/740 |

FOREIGN PATENT DOCUMENTS

JP            11261254 A  *  9/1999    ........... H05K 5/0052

* cited by examiner

*Primary Examiner* — A. Dexter Tugbang
(74) *Attorney, Agent, or Firm* — ScienBiziP, P.C.

(57) ABSTRACT

A device for installing an elastic sealing ring on an electronic device includes a clamp module and a pressing module. The clamp module includes a sliding column defining two grooves, two linkage plates, and two pins secured on the bottom end of the linkage plates. The pressing module includes a bracket and a knockout plate. The linkage plates are rotatably installed on the bracket and the sliding column (Continued)

can slide relative to the bracket. The knockout plate can slide relative to the bracket, to install the sealing ring on an electronic device.

20 Claims, 9 Drawing Sheets

(51) Int. Cl.
*F16J 15/02* (2006.01)
*B25B 7/20* (2006.01)
*B25B 7/10* (2006.01)
*B25B 9/04* (2006.01)

US 10,136,569 B2

INSTALLATION FIXTURE FOR INSTALLING SEALING RING

CROSS-REFERENCE TO RELATED APPLICATIONS

This application claims priority to Chinese Patent Application No. 201511014697.9 filed on Dec. 31, 2015, the contents of which are incorporated by reference herein.

FIELD

The subject matter herein generally relates to handling of flexible components, and more particularly to an installation fixture for a sealing ring.

BACKGROUND

A sealing ring is installed in an electronic device to make the electronic device watertight or water-resistant. Each sealing ring has an elastic coefficient and will be damaged if the elastic coefficient is exceeded.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
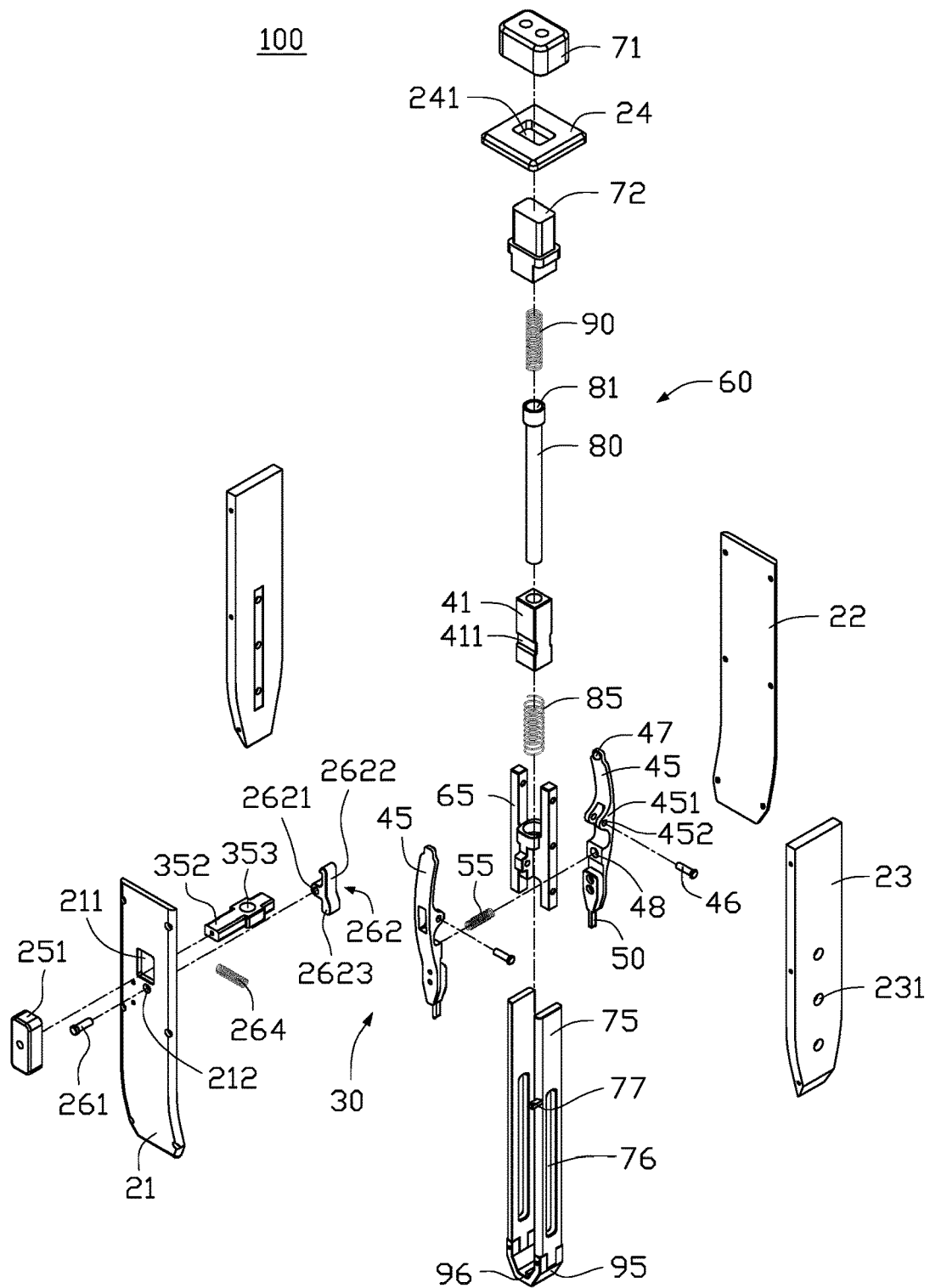
FIG. 1 is an isometric, exploded view of an embodiment of an installation fixture.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 illustrates one embodiment of an installation fixture 100. The installation fixture 100 is configured to install a sealing ring 10 (shown in FIG. 3) on an electronic device (not shown). The installation fixture 100 includes a shell 20, a clamp module 30 installed in the shell 20 and a pressing module 60 installed in the shell 20.

The sealing ring 10 is substantially an O-shaped sealing ring. The sealing ring 10 is elastically expandable to be installed on the electronic device.

Figure 2:
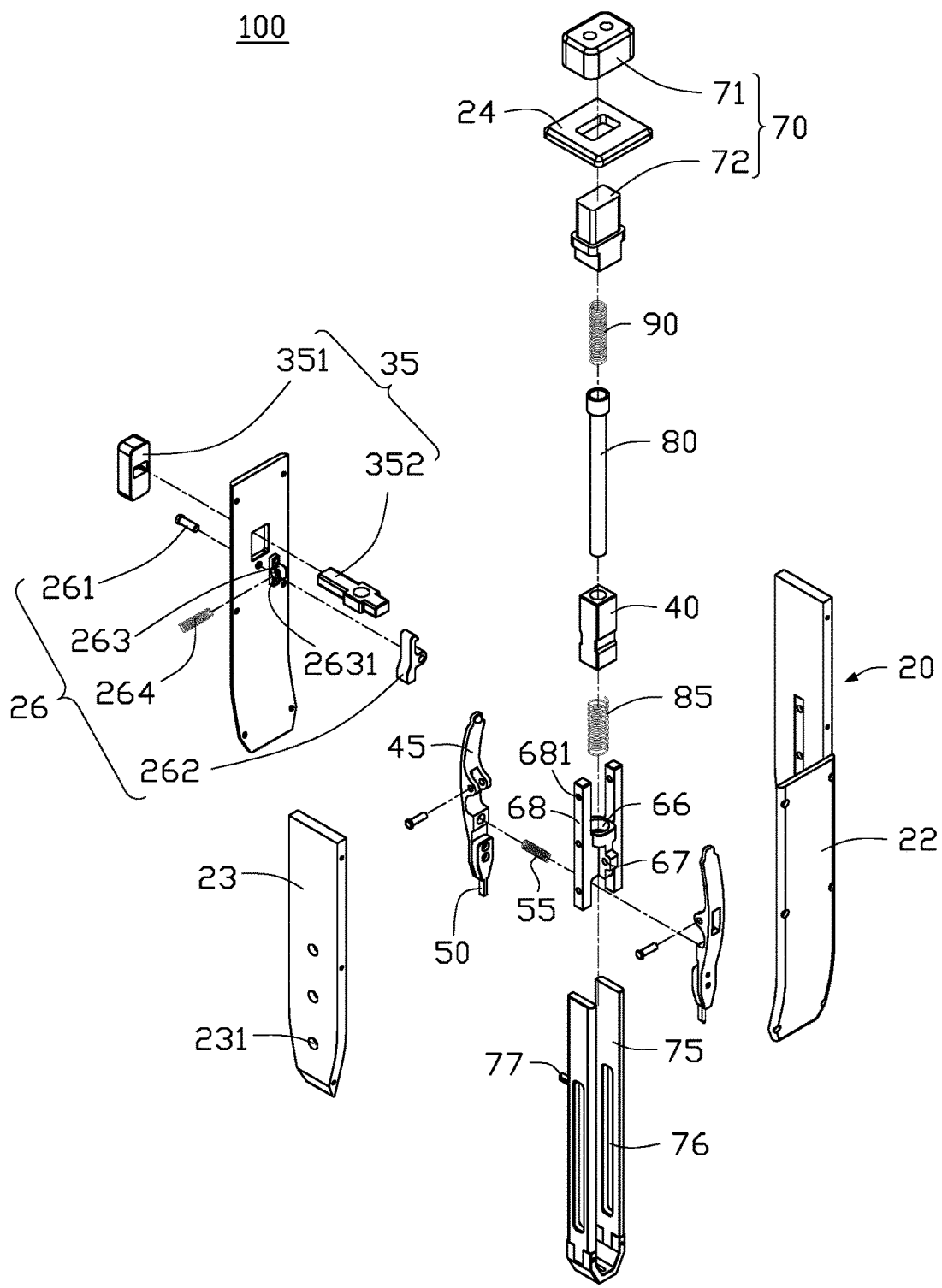
FIG. 2 is an isometric, exploded view of the installation fixture of FIG. 1, but viewed from another angle.

FIGS. 1 and 2 illustrate the shell 20 including a front plate 21, a rear plate 22 opposite to the front plate 21, two parallel side plates 23, and a cover 24. A plurality of fasteners (not shown) is configured to secure the front plate 21, the rear plate 22, the side plates 23, and the cover 24 together. The bottom end of the front plate 21, the rear plate 22 and the side plates 23 are bent inwards to cooperatively define a gap 25 (shown in FIG. 5).

The front plate 21 defines an opening 211 and a securing hole 212 below the opening 211. A latch portion 26 is located inside the front plate 21. The latch portion 26 includes a pivot shaft 261 configured to be inserted into the securing hole 212 and a latch member 262 configured to be rotatably installed on the pivot shaft 261. The latch portion 26 also includes a base 263 secured on the inside of the front plate 21 and a first resilient member 264. The middle portion of the latch member 262 defines a through hole 2621, and the pivot shaft 261 is configured to be inserted into the through hole 2621. The latch member 262 is equipped with a latch block 2622 and a stopper block 2623 respectively located on the upper and the lower ends of the through hole 2621. The latch block 2622 is elastically deformable. The stopper block 2623 defines a blind hole (not shown) toward the base 263. The base 263 defines a blind hole 2631 toward the latch member 262. The first resilient member 264 can be elastically deformed. The two ends of the first resilient member 264 are respectively received in the blind hole of the stopper block 2623 and in the blind hole 2631 of the base 263.

The middle portion of the two side plates 23 defines a plurality of positioning holes 231. The cover 24 is secured on the top end of the front plate 21, the rear plate 22, and the two side plates 23. The cover 24 defines an opening 241, and the pressing module 60 can pass through the opening 241.

The clamp module 30 includes a clamp switch 35, a hollow sliding column 40, two linkage plates 45, two pins 50 secured on the bottom end of the two linkage plates 45, and a second resilient member 55.

The clamp switch 35 includes an operating plate 351 and a pressing plate 352 connected with the operating plate 351. The pressing plate 352 defines a through hole 353. The sliding column 40 includes four sidewalls 41. Two grooves 411 are respectively defined on opposite sidewalls 41. Each linkage plate 45 is curved, and two sides of the middle portion of each linkage plate 451 are each equipped with a pivot plate 451. Each pivot plate 45 defines a pivot hole 452.

A pivot shaft 46 is configured to pass through the two pivot holes 452. The top end of each linkage plate 45 is equipped with a protrusion 47. The protrusion 47 is configured to resist against the sidewalls 41. Each linkage plate 45 defines a blind hole 48 below the pivot plate 451. The two pins 50 are secured on the bottom end of the linkage plate 45, and the pins 50 are configured to be inserted into the sealing ring 10.

The pressing module 60 includes a bracket 65, a pressing switch 70, two connecting plates 75 connected with the pressing switch 70, a positioning pole 80, a third resilient member 85, a fourth resilient member 90, and a knockout plate 95.

The bracket 65 is equipped with a receiving groove 66 to receive the positioning pole 80. The bracket 65 is equipped with a limiting hole 67 below both ends of the receiving groove 66, and the pivot shaft 46 is inserted into the limiting hole 67. A securing pole 68 is located at each side of the receiving groove 66. Each securing pole 68 defines a plurality of securing holes 681. The fasteners can pass through the positioning hole 231 and the securing hole 681 to secure the securing pole 68 on the side plate 23. The pressing switch 70 includes a button 71 and an adapter block 72 connected with the button 71. The adapter block 72 defines a containing hole 721 (shown in FIG. 5).

The two connecting plates 75 are parallel to each other. The top end of each connecting plate 75 is fixed to the adapter block 72. Each connecting plate 75 defines a sliding groove 76. The securing pole 68 is configured to be received and can slide in the sliding groove 76. One of the connecting plates 75 is equipped with a pressure pole 77 towards the latch portion 26. The pressure pole 77 is configured to resist against the stopper block 2623 and to rotate the stopper block 2623.

The bottom end of the positioning pole 80 is configured to pass through the through hole 353, the sliding column 40 and the third resilient member 85 being inserted into the receiving groove 66. The third resilient member 85 can be elastically deformed, and opposite ends of the third resilient member 85 resist against the bracket 65 and against the sliding column 40. The top end of the positioning pole 80 defines a recess 81. The fourth resilient member 90 can be elastically deformed, and the ends of the fourth resilient member 90 are respectively received in the containing hole 721 and in the recess 81. The ends of the knockout plate 95 are respectively connected with a bottom end of the two connecting plates 75. The middle portion of the knockout plate 95 defines a slide way 96. The two pins 50 can pass through the slide way 96.

Figure 3:
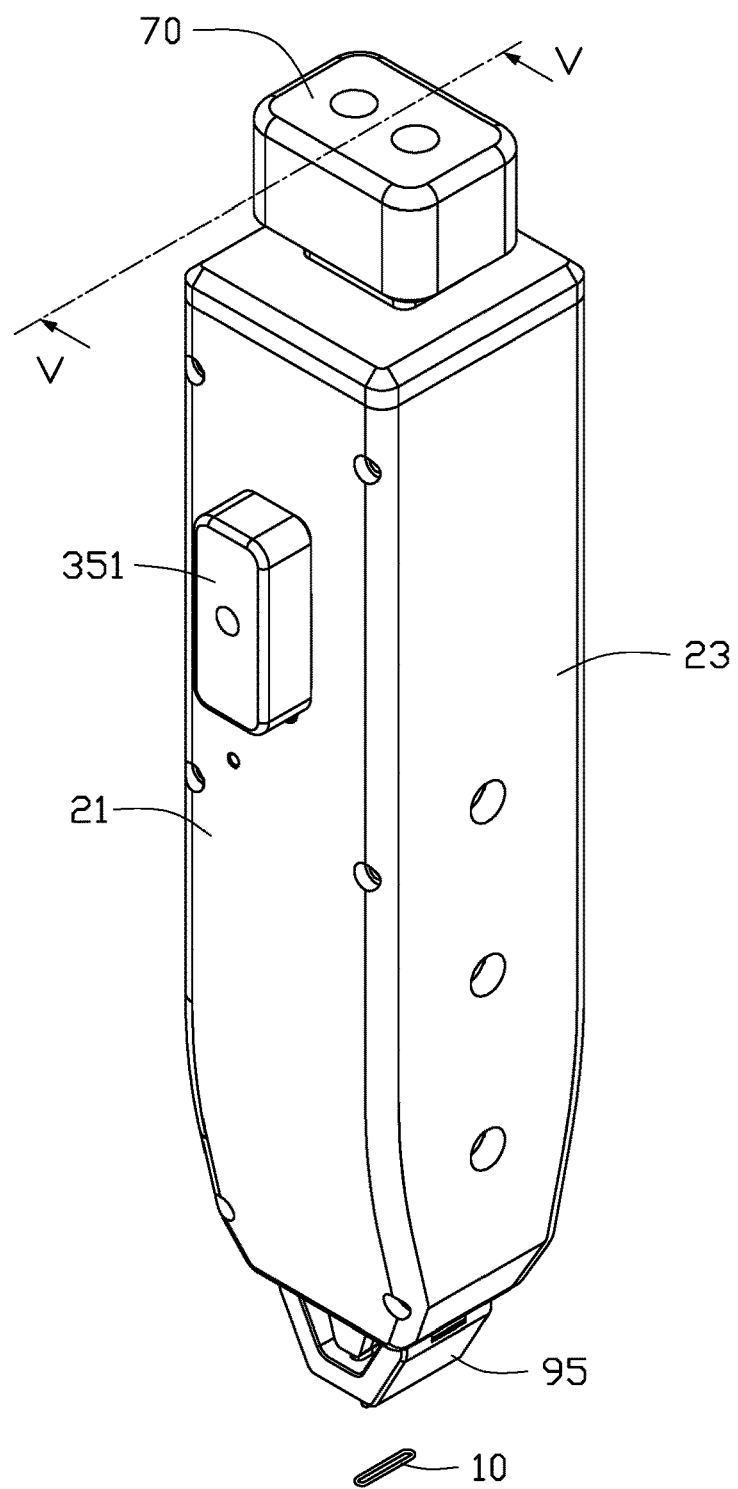
FIG. 3 is an isometric, exploded view of the installation fixture of FIG. 1 and a sealing ring.
Figure 4:
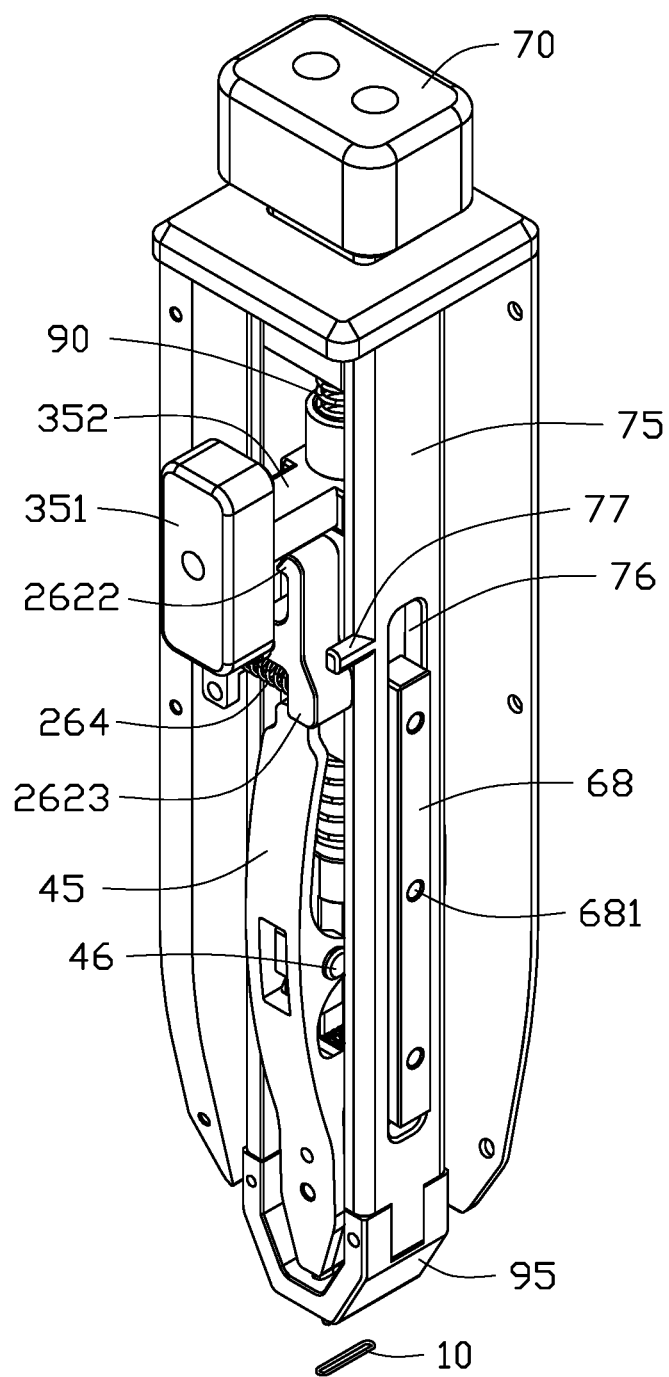
FIG. 4 is an isometric, exploded view of the installation fixture and the sealing ring of FIG. 3, but viewed from another angle.
Figure 5:
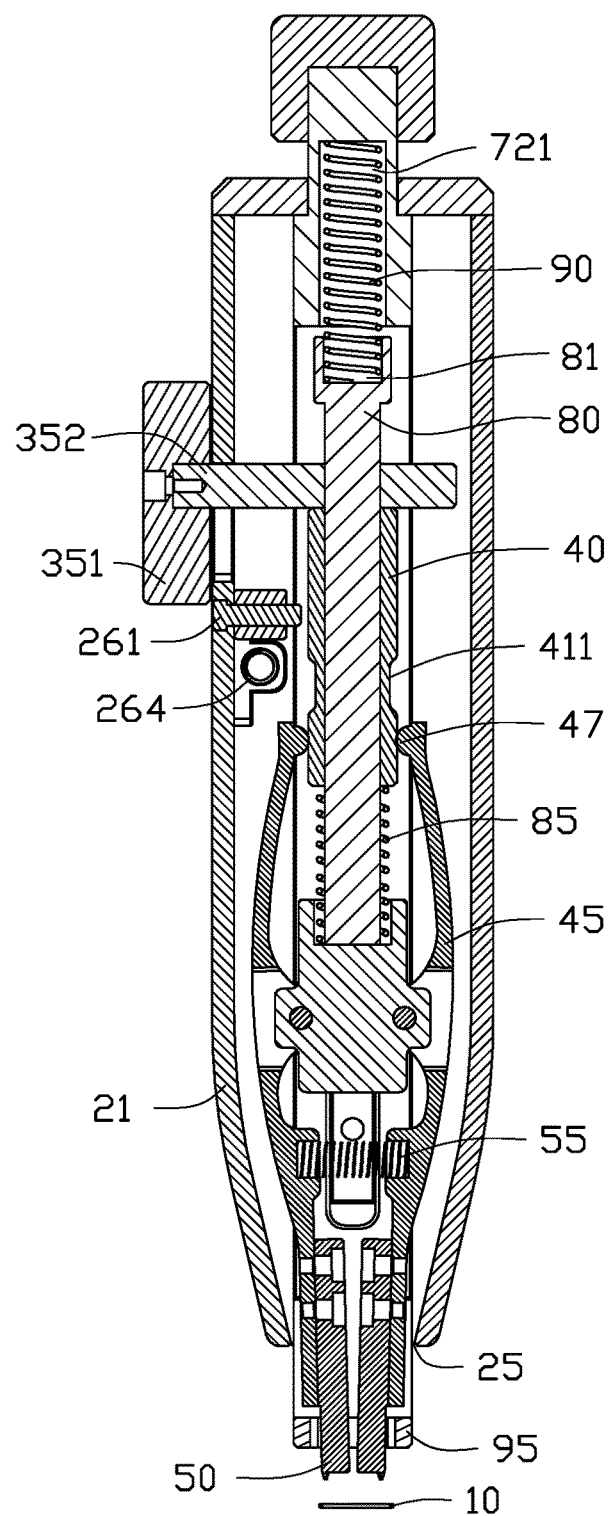
FIG. 5 is a cross sectional view of the installation fixture and the sealing ring of FIG. 3 along a line V-V, wherein two pins are in a first position and a pressing switch is yet to be pressed.

FIGS. 3 to 5 illustrate assembly; the two connecting plates 75 are located on the two securing poles 68, and the two securing poles 68 are received in the sliding groove 76 of the connecting plate 75. The two side plates 23 are located on the two securing poles 68, and the positioning holes 231 are aligned with the securing hole 681. The fasteners pass through the securing holes 681 and the positioning holes 231 to secure the bracket 65 and the two side plates 23 together.

The positioning pole 80 passes through the through hole 353, the sliding column 40, and the second resilient member 85, to be received in the receiving groove 66. The two pins 50 are installed on the bottom end of the two linkage plates 45, and the pivot hole 452 of the linkage plate 45 is aligned with the limiting hole 67 of the bracket 65. The pivot shaft 46 passes through the pivot hole 452 and the limiting hole 67 to install the rotatable linkage plate 45 on the bracket 65. The second resilient member 55 is elastically constricted and the ends are respectively received in the blind hole 48 of each linkage plate 45. The second resilient member 55 pushes against the bottom end of the linkage plate 45 and the protrusion 47 resists against the two sidewalls 41. The two pins 50 are close to each other and in the first position. The knockout plate 95 is installed on the bottom end of the two connecting plates 75 and the two pins 50 pass through the slide way 96.

The pivot shaft 261 passes through the securing hole 212 of the front plate 21 and the through hole 2621 to install the rotatable latch member 262 on the inside of the front plate 21. The ends of the first resilient member 264 are respectively received in the blind hole of the latch member 262 and in the blind hole 2631 of the base 263. The pressing plate 352 is resisted above the latch block 2622 of the latch member 262. The front plate 21 is connected with the two side plates 23. The pressing plate 352 passes through the opening 211 of the front plate 21 to be connected with the operating plate 351.

Opposite ends of the fourth resilient member 90 are respectively received in the recess 81 and in the containing hole 721. The adapter block 72 is connected with the top end of the two connecting plates 75. The cover 24 is connected with the front plate 21 and the two side plates 23. The adapter block 72 passes through the opening 241 of the cover 24 to be connected with the button 71. The adapter block 72 is moved up under the fourth resilient member 90, driving the two connecting plates 75 and the knockout plate 95 upward. The rear plate 22 is connected with the two side plates 23 and the cover 24. The installation fixture 100 is thus completely assembled.

Figure 6:
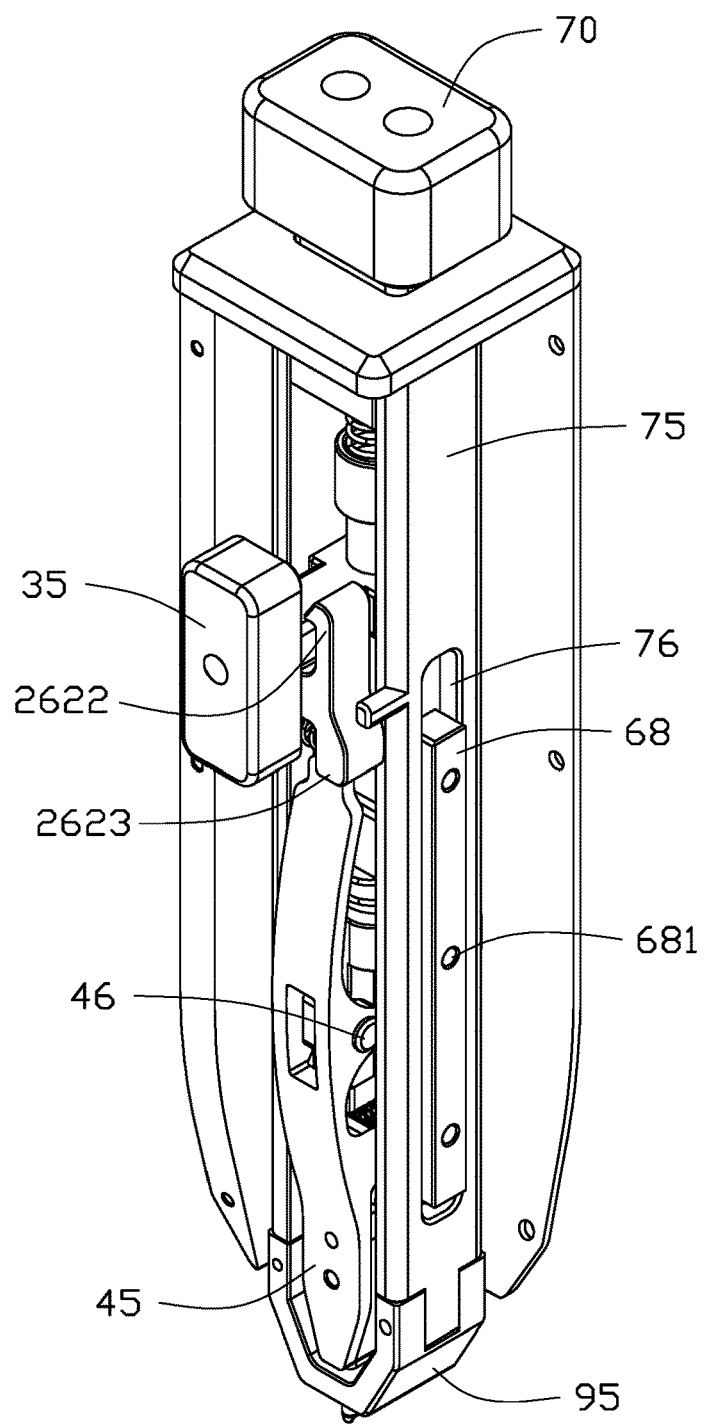
FIG. 6 is an isometric, assembled view of the installation fixture and the sealing ring of FIG. 3.
Figure 7:
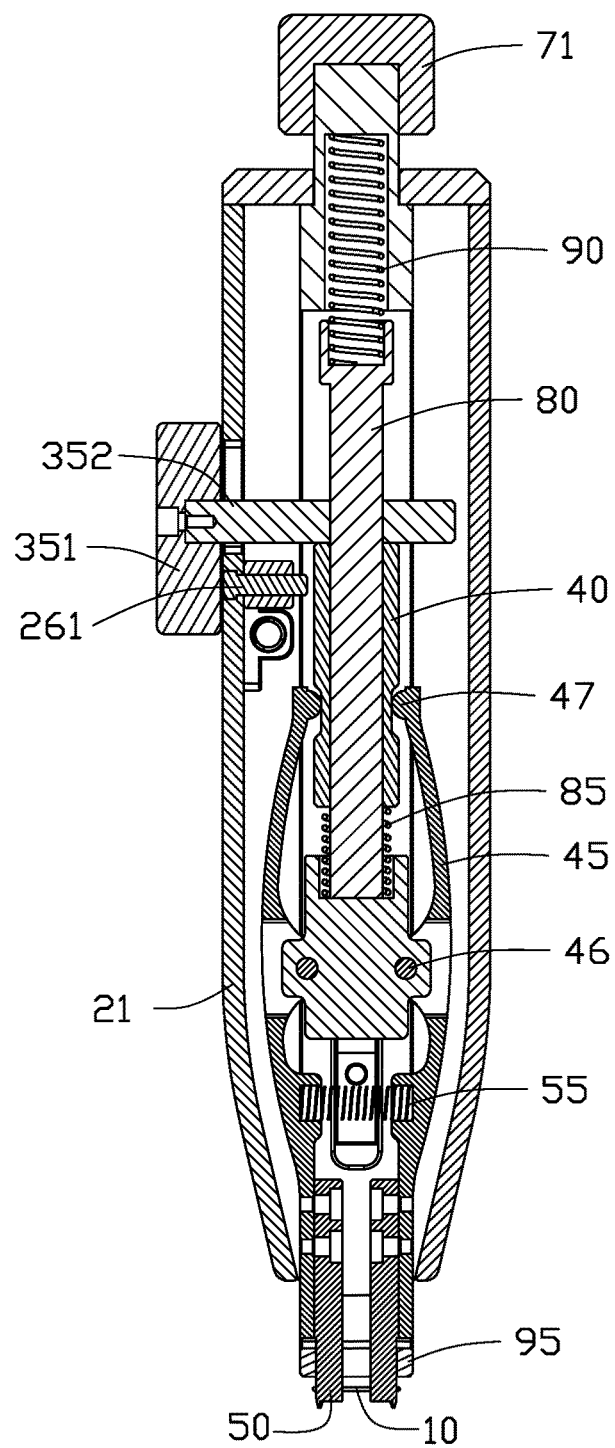
FIG. 7 is a cross sectional view of the installation fixture and the sealing ring of FIG. 3 along a line V-V, wherein two pins are in a second position and the sealing ring is set on the two pins.

FIGS. 6 and 7 show a clamping of the sealing ring 10. The two pins are inserted into the sealing ring 10. The operating plate 351 is pressed, and the operating plate 351 pushes the latch block 2622 to rotate the latch member 262, and the first resilient member 264 is elastically constricted. When the pressing plate 352 is slid over the latch block 2622, the first resilient member 264 responds to latch the latch block 2622 on the pressing plate 352, thus preventing the pressing plate 352 from moving. The sliding column 40 is slid down relative to the positioning pole 80 and the third resilient member 85 is elastically constricted. When the protrusion 47 is received in the groove 411, the third resilient member 85 responds to rotate the linkage plates 45. The two pins 50 are thus far away from each other and located in a second position, to elastically expand the sealing ring 10.

Figure 8:
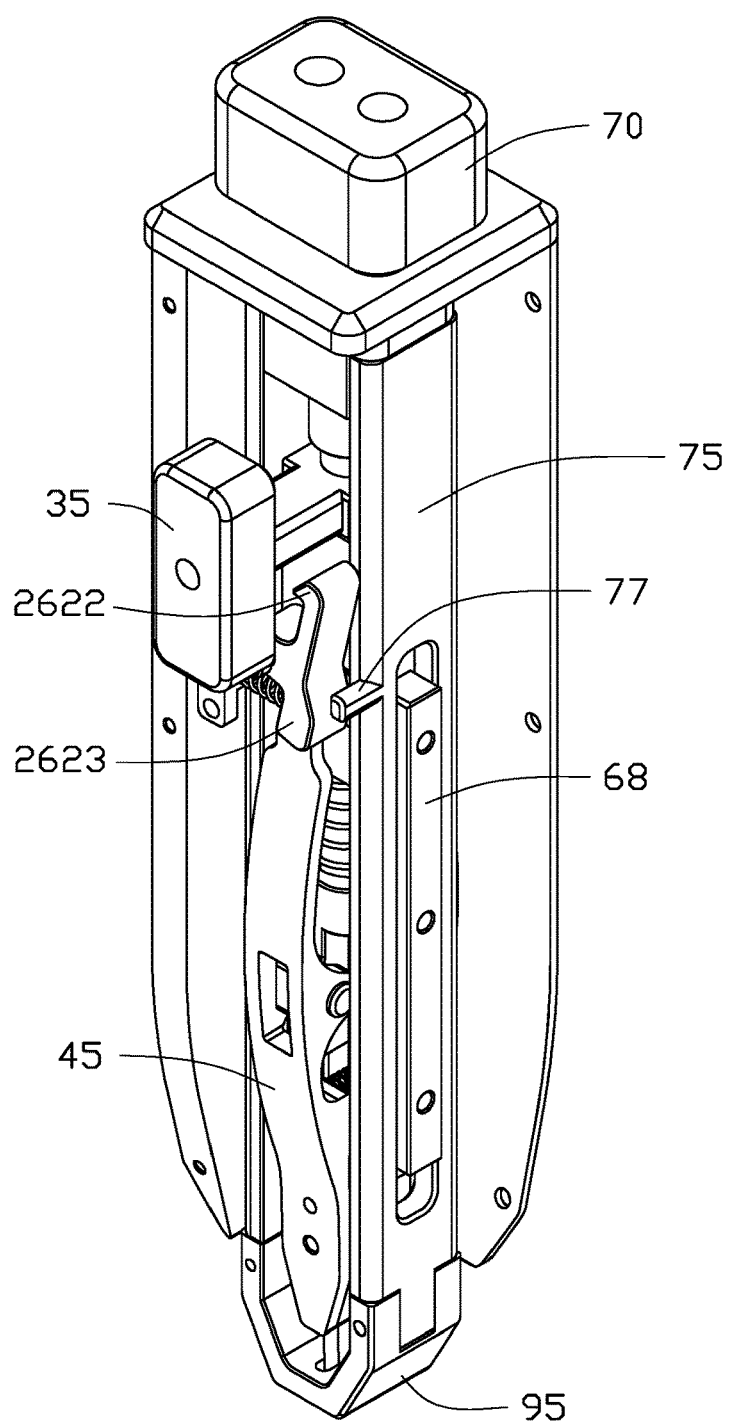
FIG. 8 is an isometric, assembled view of the installation fixture and the sealing ring of FIG. 3.
Figure 9:
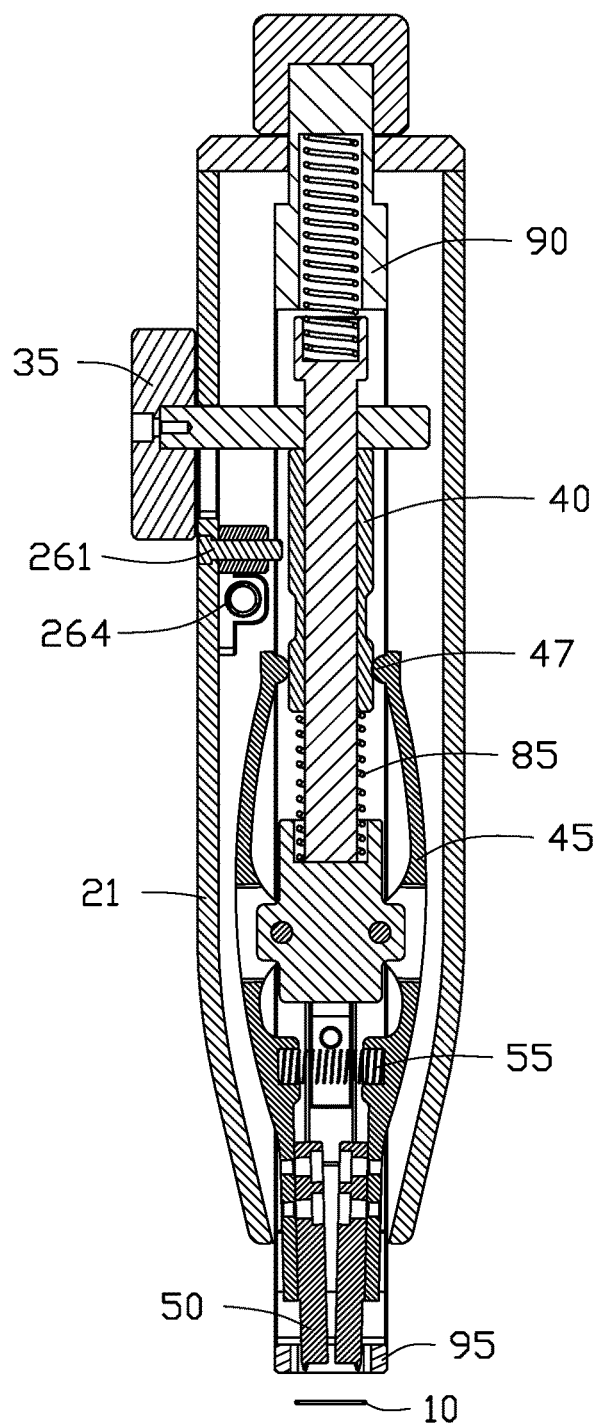
FIG. 9 is a cross sectional view of the installation fixture and the sealing ring of FIG. 3 along a line V-V, wherein two pins are in the first position and the pressing switch is pressed.

FIGS. 8 and 9 show the sealing ring 10 being installed on the electronic device, the sealing ring 10 is shown located above the electronic device. The button 71 is pressed, the connecting plates and the knockout plate 95 are driven down under the adapter block 72, and the fourth resilient member 90 is elastically constricted. The pressure pole 77 resists against the stopper block 2623 to rotate the stopper block 2623, and the first resilient member 264 is thus elastically constricted. The latch block 2622 is removed from the pressing plate 352 by rotating. The third resilient member 85 responds to slide up the sliding column 40 and the clamp switch 35, the protrusion 47 is removed from the groove 411 and closely resisted against the sidewall 41. The second resilient member 55 is elastically constricted to rotate the linkage plate 45, the two pins 50 come closer to each other to return to the first position. The knockout plate 95 pushes the sealing ring 10 to remove from the pins 50 to install the sealing ring 10 on the electronic device.

The embodiments shown and described above are only examples. Many details are often found in the art such as the other features of an installation fixture. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An installation fixture configured to install a sealing ring on an electronic device comprising:
 a clamp module comprising:
  a sliding column defining two grooves;
  two linkage plates; and
  two pins secured on a bottom end of the linkage plates;
 a pressing module comprising:
  a bracket; and
  a knockout plate;
 wherein the linkage plates are rotatably installed on the bracket, the sliding column being slidable relative to the bracket to locate the two pins in a first position or in a second position;
 wherein when the two pins are in the first position, a top end of the linkage plate resists against the sliding column, the two pins are proximate one another and passed through the knockout plate;
 wherein when the two pins are in the second position, the sliding column is slid down and the top end of the linkage plates are received in the grooves, the two pins are which further away from each other than when in the first position are configured to elastically expand the sealing ring, the knockout plate being slid relative to the bracket is configured to install the sealing ring on the electronic device.

2. The installation fixture of claim 1, wherein the bracket defines two limiting holes, each of the linkage plates defines two pivot holes, a pivot shaft is inserted into the pivot holes and the limiting holes to rotatably install the linkage plate on the bracket.

3. The installation fixture of claim 2, wherein the each of the linkage plates defines a blind hole below the pivot hole, and a second resilient member is elastically constricted and two opposite ends of the second resilient member are received in the two blind holes.

4. The installation fixture of claim 3, wherein the sliding column comprises four sidewalls, a protrusion extending from the top end of each of the linkage plates, and when the two pins are in the first position, the second resilient member responds to resist the protrusion against the sidewall of the sliding column.

5. The installation fixture of claim 1, wherein each side of the bracket comprises a securing pole, each securing pole defines a plurality of securing holes, the installation fixture further comprises a shell, a plurality of fasteners pass through the shell to insert into the securing holes to secure the bracket in the shell.

6. The installation fixture of claim 5, wherein the bracket defines a receiving groove between the two securing poles, the pressing module comprises a positioning pole received in the receiving groove, the sliding column is set on the positioning pole.

7. The installation fixture of claim 6, wherein the pressing module further comprises a third resilient member, two opposite ends of the third resilient member are respectively relied on the receiving groove and the sliding column, the third resilient member can respond to slide up the sliding column.

8. The installation fixture of claim 5, wherein the shell comprises a front plate, an inside of the front plate is equipped with a latch member, the clamp module comprises a clamp switch, the latch member can be rotated to secure the clamp switch.

9. The installation fixture of claim 8, wherein the latch member comprises a stopper block, the pressing module comprises a pressure pole, the pressure pole can be relied on the stopper block.

10. The installation fixture of claim 1, wherein the pressing module further comprises a pressing switch and a connecting plate connected with the pressing switch, the pressing switch is capable of pushing the connecting plate to push the knockout plate to install the sealing ring on the electronic device.

11. A sealing ring installation mechanism comprising:
 a sealing ring;
 a clamp module comprising:
  a sliding column defining two grooves;
  two linkage plates; and
  two pins secured on a bottom end of the linkage plates;
 a pressing module comprising:
  a bracket; and
  a knockout plate;
 wherein the linkage plates are rotatably installed on the bracket, the sliding column being slidable relative to the bracket to locate the two pins in a first position or in a second position;
 wherein when the two pins are in the first position, a top end of the linkage plate resists against the sliding column, the two pins are proximate one another and passed through the knockout plate;
 wherein when the two pins are in the second position, the sliding column is slid down and the top end of the linkage plates are received in the grooves, the two pins which are further away from each other than when in the first position are configured to elastically expand the sealing ring, the knockout plate being slid relative to the bracket is configured to install the sealing ring on an electronic device.

12. The sealing ring installation mechanism of claim 11, wherein the bracket defines two limiting holes, each of the linkage plates defines two pivot holes, a pivot shaft is inserted into the pivot holes and the limiting holes to rotatably install the linkage plate on the bracket.

13. The sealing ring installation mechanism of claim 12, wherein each of the linkage plates defines a blind hole below the pivot hole, and a second resilient member is elastically constricted and two opposite ends of the second resilient member are received in the two blind holes.

14. The sealing ring installation mechanism of claim 13, wherein the sliding column comprises four sidewalls, a protrusion extending from the top end of each of the linkage plates, and when the two pins are in the first position, the second resilient member responds to resist the protrusion against the sidewall of the sliding column.

15. The sealing ring installation mechanism of claim 11, wherein each side of the bracket comprises a securing pole, each securing pole defines a plurality of securing holes, the installation fixture further comprises a shell, a plurality of fasteners pass through the shell to insert into the securing holes to secure the bracket in the shell.

16. The sealing ring installation mechanism of claim 15, wherein the bracket defines a receiving groove between the two securing poles, the pressing module comprises a positioning pole received in the receiving groove, the sliding column is set on the positioning pole.

17. The sealing ring installation mechanism of claim 16, wherein the pressing module further comprises a third resilient member, two opposite ends of the third resilient member are respectively relied on the receiving groove and the sliding column, the third resilient member can respond to slide up the sliding column.

18. The sealing ring installation mechanism of claim 15, wherein the shell comprises a front plate, an inside of the front plate is equipped with a latch member, the clamp module comprises a clamp switch, the latch member can be rotated to latch on the clamp switch.

19. The sealing ring installation mechanism of claim 18, wherein the latch member comprises a stopper block, the pressing module comprises a pressure pole, the pressure pole can be relied on the stopper block.

20. The sealing ring installation mechanism of claim 11, wherein the pressing module further comprises a pressing switch and a connecting plate connected with the pressing switch, the pressing switch is capable of pushing the connecting plate to push the knockout plate to install the sealing ring on the electronic device.

* * * * *